United States Patent
Kuo

(10) Patent No.: US 7,435,985 B2
(45) Date of Patent: Oct. 14, 2008

(54) ZERO-CROSSING POINT DETECTION CIRCUIT

(75) Inventor: Heng-Chen Kuo, Taipei Hsien (TW)

(73) Assignee: Hon Hai Precision Indsutry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/765,459

(22) Filed: Jun. 20, 2007

(65) Prior Publication Data

US 2008/0157822 A1    Jul. 3, 2008

(30) Foreign Application Priority Data

Dec. 27, 2006    (CN) .................. 2006 1 0201418

(51) Int. Cl.
*H03K 5/153* (2006.01)

(52) U.S. Cl. .................. 250/551; 323/235; 327/451

(58) Field of Classification Search .................. 250/551; 327/104, 451–463; 324/76.77, 86; 232/235, 232/319

See application file for complete search history.

(56) References Cited

U.S. PATENT DOCUMENTS

| | | | |
|---|---|---|---|
| 4,480,200 A | | 10/1984 | Tan et al. |
| 4,495,461 A | * | 1/1985 | Gilliam ........................ 324/86 |
| 4,804,923 A | * | 2/1989 | Black .......................... 327/104 |
| 5,239,209 A | * | 8/1993 | Hockman ..................... 327/79 |
| 5,506,573 A | * | 4/1996 | Ewing et al. ................. 340/644 |
| 5,652,503 A | * | 7/1997 | Urban et al. ................. 323/235 |
| 6,049,284 A | * | 4/2000 | Heuer ......................... 340/648 |
| 2007/0007826 A1 | * | 1/2007 | Mosebrook et al. ......... 307/139 |

* cited by examiner

*Primary Examiner*—John R Lee
(74) *Attorney, Agent, or Firm*—Frank R. Niranjan

(57) ABSTRACT

A zero-crossing point detection circuit includes a hot line input, a neutral line input, a first zero-crossing point output, and a first optical coupler. The first optical coupler includes a first light-emitting diode (LED) and a first optical transistor. The hot line input and neutral line input are respectively connected to two terminals of the first LED. An emitter of the first optical transistor is grounded. A collector of the first optical transistor is connected to a direct current (DC) power source. The collector of the first optical transistor is also connected to the first zero-crossing point output.

6 Claims, 2 Drawing Sheets

ZERO-CROSSING POINT DETECTION CIRCUIT

BACKGROUND OF THE INVENTION

1. Field of the Invention

The present invention relates to detection circuits, and particularly to a zero-crossing point detection circuit.

2. Description of Related Art

Zero-crossing point detection circuits are well known for detecting the instances at which a signal voltage changes from negative to positive and from positive to negative, such as in uninterrupted power supply (UPS) system, or the like.

Generally speaking, such a zero-crossing point detection circuit includes a level comparator circuit consisting of a differential operational amplifier of high gain, some resistors, and some capacitors. However, zero-crossing point detection circuits are directly connected to a power switch circuit and thus are susceptible to static jamming, coupling jamming and the like. Furthermore, the comparator circuit is a simulation circuit which is very complicated to select proper resistors and capacitors.

What is desired, therefore, is to provide a zero-crossing point detection circuit resistant to noise jamming.

SUMMARY OF THE INVENTION

An exemplary zero-crossing point detection circuit includes a hot line input, a neutral line input, a first zero-crossing point output, and a first optical coupler. The first optical coupler includes a first light-emitting diode (LED) and a first optical transistor. The hot line input and neutral line input are respectively connected to two terminals of the first LED. An emitter of the first optical transistor is grounded. A collector of the first optical transistor is connected to a direct current (DC) power source. The collector of the first optical transistor is also connected to the first zero-crossing point output.

Other advantages and novel features of the present invention will become more apparent from the following detailed description of preferred embodiment when taken in conjunction with the accompanying drawings, in which:

DETAILED DESCRIPTION OF THE INVENTION

Figure 1:
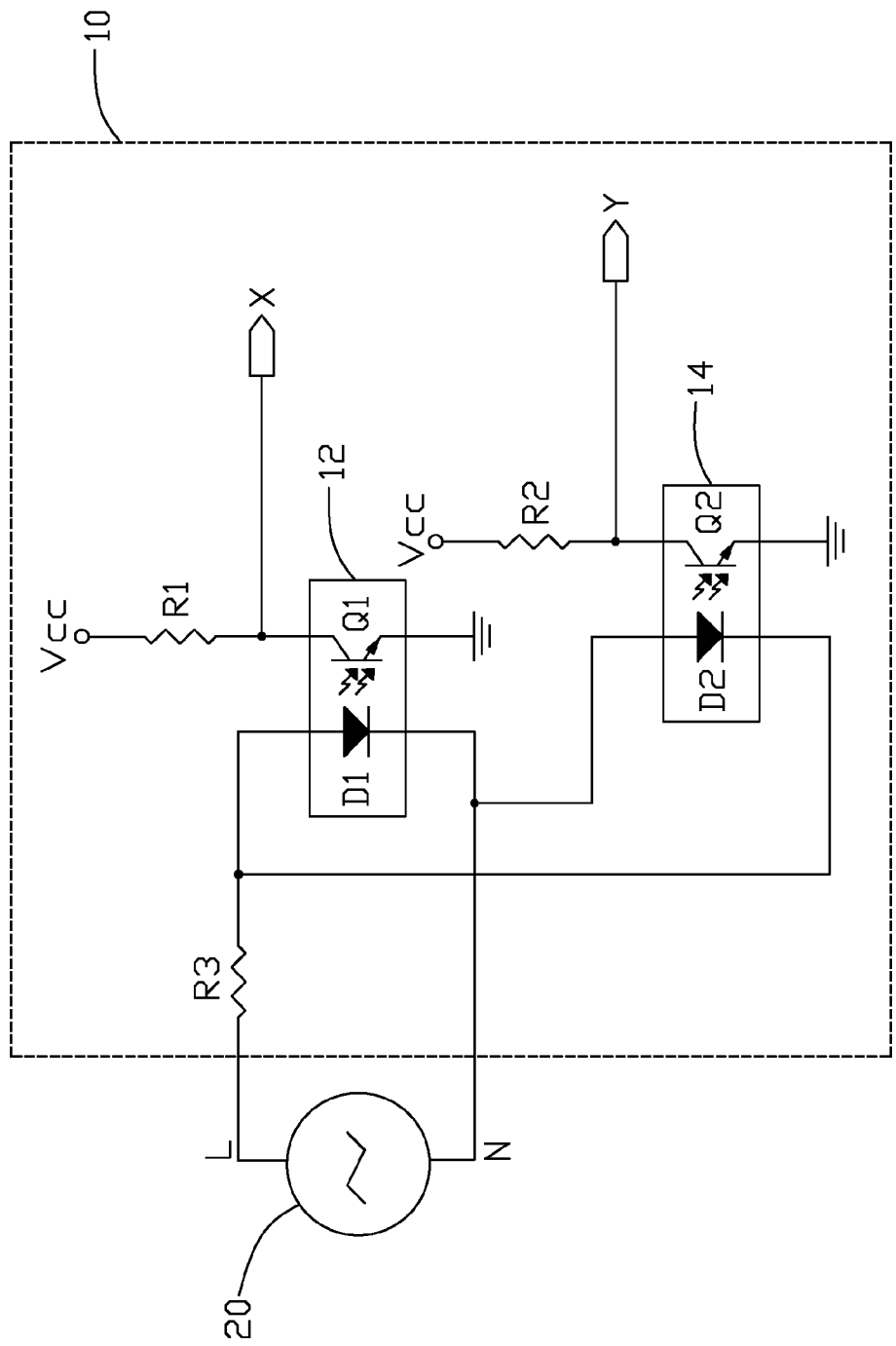
FIG. 1 is a circuit diagram of a zero-crossing point detection circuit in accordance with a first embodiment of the present invention, together with an AC power source connected thereto.

Referring to FIG. 1, a zero-crossing point detection circuit 10 in accordance with a first embodiment of the present invention is provided for detecting zero-crossing points of an alternating current (AC) power source 20 such as a 110V AC power source. The zero-crossing point detection circuit includes three resistors R1, R2, and R3, a first optical coupler 12, a second optical coupler 14, a direct current (DC) power source Vcc, a first zero-crossing point output X, and a second zero-crossing point output Y. The first optical coupler 12 includes a first light-emitting diode (LED) D1 and a first optical transistor Q1. The second optical coupler 14 includes a second LED D2 and a second optical transistor Q2.

A first end of the resistor R3 is a hot line input adapted for connecting to a hot line L of the AC power source 20. A second end of the resistor R3 is connected to an anode of the first LED D1. A cathode of the first LED D1 is a neutral line input adapted for connecting to a neutral line N of the AC power source 20. An emitter of the optical transistor Q1 is grounded. A collector of the optical transistor Q1 is connected to the DC power source Vcc via the resistor R1, and connected to the first zero-crossing point output X.

A cathode of the second LED D2 is connected to the anode of the first LED D1, and an anode of the second LED D2 is connected to the cathode of the first LED D1. An emitter of the optical transistor Q2 is grounded. A collector of the optical transistor Q2 is connected to the DC power source Vcc via the resistor R2, and connected to the second zero-crossing point output Y. In this embodiment, the first zero-crossing point output X is a positive zero-crossing point output, and the second zero-crossing point output Y is a negative zero-crossing point output. Resistances of the resistors R1 and R2 are both approximately 10KΩ, and a resistance of the resistor R3 is approximately 22KΩ. Voltage of the DC power source Vcc is 5V.

Figure 2:
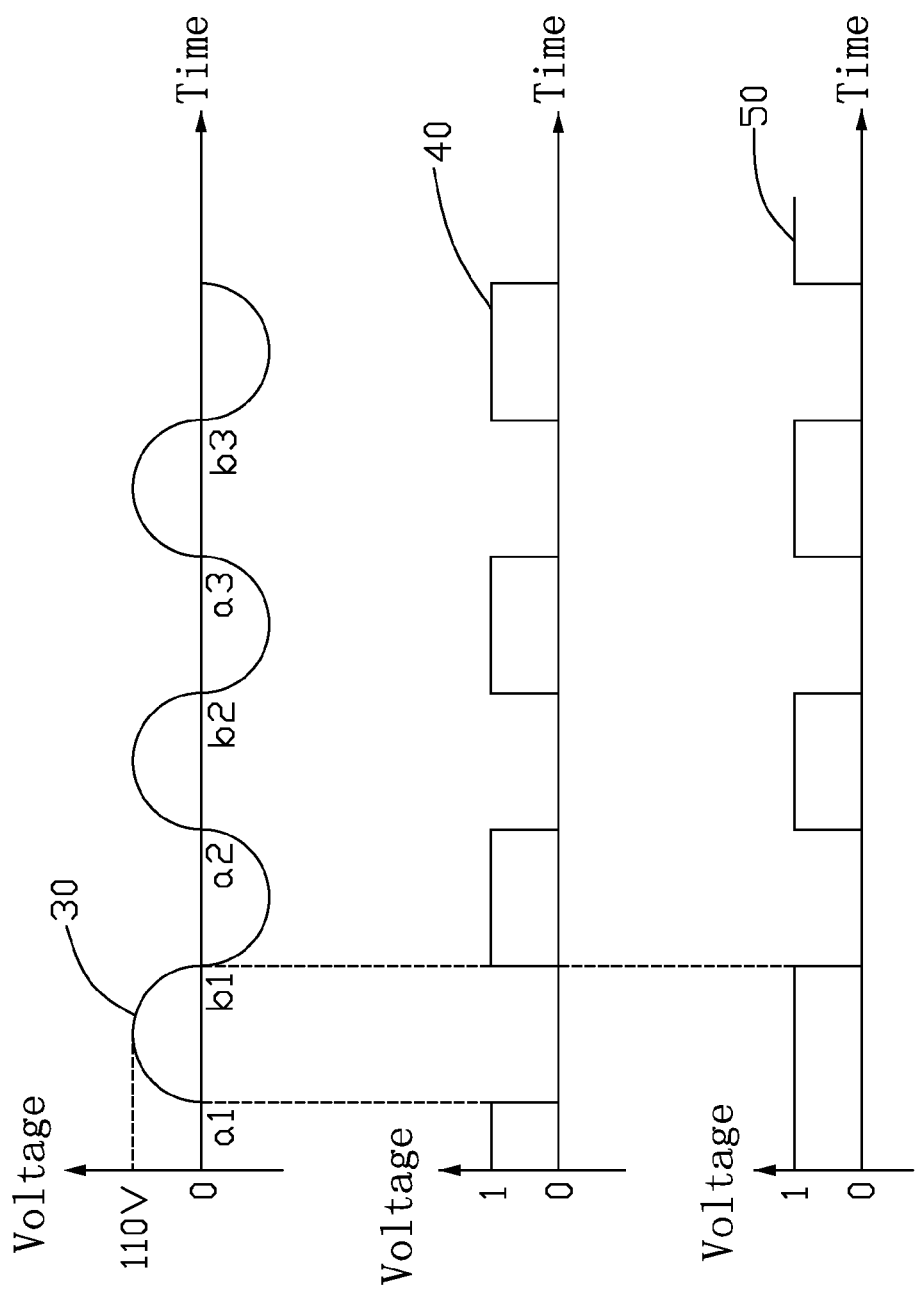
FIG. 2 is an output waveform chart of the zero-crossing point detection circuit corresponding to the AC power source of FIG. 1.

Referring also to FIG. 2, output waveforms 40 and 50 of the zero-crossing point outputs X and Y corresponding to an output waveform 30 of the AC power source 20 are shown. The output waveform 30 of the AC power source 20 is a sine wave and includes a plurality of positive zero-crossing points a1, a2, a3 . . . and a plurality of negative zero-crossing points b1, b2, b3 . . . . At the beginning, the zero-crossing point outputs X and Y are both at a high voltage level. When output of the AC power source 20 passes the first positive zero-crossing point a1, the first optical coupler 12 turns on, so that the positive zero-crossing point output X is changed to a low voltage level until output of the AC power source 20 passes the first negative zero-crossing point b1, at which time the first optical coupler 12 turns off, so that the positive zero-crossing point output X is changed to the high voltage level until output of the AC power source 20 passes the second positive zero-crossing point a2, and then it goes on like before.

When output of the AC power source 20 passes the first negative zero-crossing point b1, the second optical coupler 14 turns on, so that the negative zero-crossing point output Y is changed to a low voltage level until output of the AC power source 20 passes the second positive zero-crossing point a2, at which time the second optical coupler 14 turns off, so that the negative zero-crossing point output Y is changed to the high voltage level until output of the AC power source 20 passes the second negative zero-crossing point b2, and then it goes on like before.

When a backup power source (not shown) needs to take over from the AC power source 20, the zero-crossing point outputs X and Y of the zero-crossing point detection circuit 10 are connected to a power source switch circuit (not shown). The power source switch circuit cuts off the AC power source 20 from the electrical device and connects the backup power source to the electrical device via zero-crossing point signals from the zero-crossing point output X or zero-crossing point output Y.

If the power source switch circuit cuts off the AC power source 20 and connects the backup power source to the electrical device via zero-crossing point signals from the zero-crossing point output X only, a switching time will be operated in at least a cycle of the AC power source 20. However, if the power source switch circuit cuts off the AC power source 20 via zero-crossing point signals from the zero-crossing point output X and connects the backup power source to the electrical device via zero-crossing point signals from the zero-crossing point output Y, the switch time can be operated in a half cycle of the AC power source 20 which reduces switching time. Further, because the zero-crossing point detection circuit 10 uses two optical couplers to detect the zero-crossing points, it will suffer less noise jamming when two power sources switch, and the zero-crossing point detection circuit 10 is very simple, which costs less.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A zero-crossing point detection circuit configured for detecting zero-crossing points of an output waveform of an alternating current (AC) power source, comprising:

a hot line input configured for connecting to a hot line of the AC power source;

a neutral line input configured for connecting to a neutral line of the AC power source;

a positive zero-crossing point output, and a negative zero-crossing point output, respectively outputting a positive zero-crossing point signal and a negative zero-crossing point signal;

a first optical coupler comprising a first light-emitting diode (LED) and a first optical transistor, wherein the hot line input and neutral line input are respectively connected to two terminals of the first LED, an emitter of the first optical transistor is grounded, a collector of the first optical transistor is connected to a direct current (DC) power source, the collector of the first optical transistor is also connected to the positive zero-crossing point output to output the positive zero-crossing point signal; and a second optical coupler comprising a second LED and a second optical transistor, wherein a cathode of the second LED is connected to an anode of the first LED, and an anode of the second LED is connected to a cathode of the first LED, an emitter of the second optical transistor is grounded, a collector of the second optical transistor is connected to the DC power source, the collector of the second optical transistor is also connected to the negative zero-crossing point output to output the negative zero-crossing point signal.

2. The zero-crossing point detection circuit as claimed in claim 1, wherein the collector of the first optical transistor is connected to the DC power source via a first resistor, the hot line input is connected to its corresponding terminal of the first LED via a second resistor.

3. The zero-crossing point detection circuit as claimed in claim 2, wherein a resistance of the first resistor is approximately 10KΩ, a resistance of the second resistor is approximately 22KΩ.

4. The zero-crossing point detection circuit as claimed in claim 1, wherein the collector of the second optical transistor is connected to the DC power source via a third resistor.

5. The zero-crossing point detection circuit as claimed in claim 4, wherein a resistance of the third resistor is approximately 10KΩ.

6. The zero-crossing point detection circuit as claimed in claim 1, wherein voltage of the DC power source is 5V.

\* \* \* \* \*